United States Patent [19]

Pizzica

[11] Patent Number: 5,727,000
[45] Date of Patent: Mar. 10, 1998

[54] SIGNATURE ANALYSIS USAGE FOR MULTIPLE FAULT ISOLATION

[75] Inventor: Stephen V. Pizzica, San Pedro, Calif.

[73] Assignee: Hughes Aircraft Company, Los Angeles, Calif.

[21] Appl. No.: 579,278

[22] Filed: Dec. 27, 1995

[51] Int. Cl.$^6$ ................................................. H04R 17/00
[52] U.S. Cl. ..................................... 371/26; 371/22.4
[58] Field of Search ........................ 371/26, 22.4, 22.1, 371/24, 25.1

[56] References Cited

U.S. PATENT DOCUMENTS

| | | | |
|---|---|---|---|
| 5,220,567 | 6/1993 | Dooley et al. | 371/5.1 |
| 5,488,615 | 1/1996 | Kunoff et al. | 371/22.4 |

*Primary Examiner*—Vincent P. Canney
*Attorney, Agent, or Firm*—Leonard A. Alkov; Wanda K. Denson-Low

[57] ABSTRACT

Test equipment and test methods employing signature analysis to achieve fault isolation of parts contained in digital modules. Fault free signatures of a digital module are stored in a lookup table that are derived from physical measurement or simulation of all parts. All of the parts in the functional digital module are shorted and opened (either physically or by simulation) and each of their resulting faulty signatures are recorded in a storage device. Each signature with its corresponding faulty part is stored in the lookup table or memory. Test input signals are then applied to a tested digital module, and outputs of all parts thereof are applied to masking circuitry which allows sequential selective masking of all parts but one, for each part on the tested digital module. Outputs of the masking circuitry are applied to a multiple input shift register signal analyzer that performs pass/fail signature analysis using the applied signals. When a failure occurs during testing of the tested digital module, comparator circuitry is used to find a corresponding signature match to the stored faulty signatures. A message is then sent as an output from the comparator circuitry identifying the failed part so that the tested digital module can be repaired. The present invention does not require expensive automatic test equipment and therefore provides a more cost-effective approach to failure analysis.

5 Claims, 3 Drawing Sheets

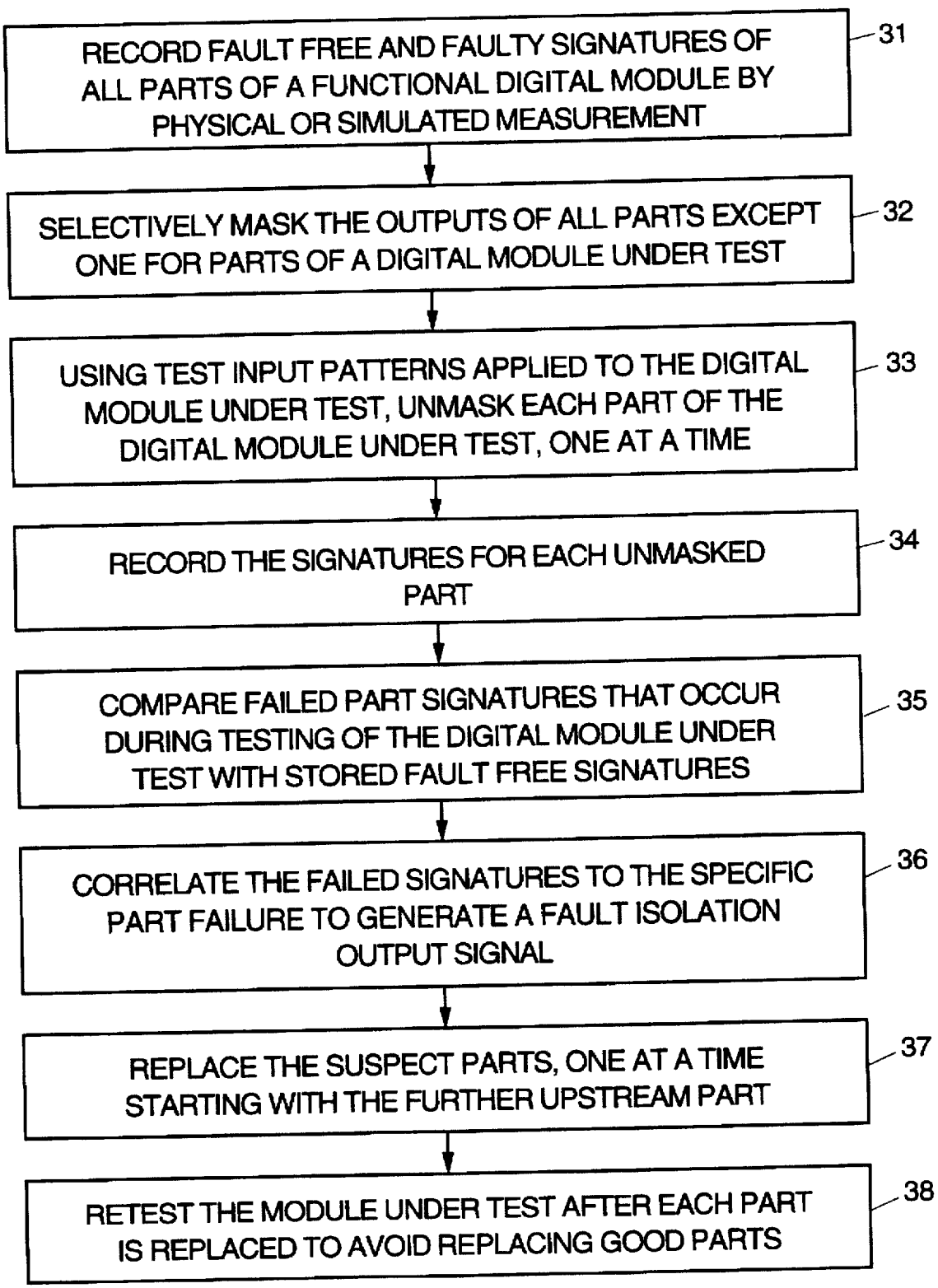

SIGNATURE ANALYSIS USAGE FOR MULTIPLE FAULT ISOLATION

BACKGROUND

This invention relates generally to test equipment, and more particularly, to test equipment and test methods employing signature analysis to achieve multiple fault isolation of parts contained in digital modules.

There are three methods that are currently used for fault isolation in digital modules. These include manual isolation using a digital voltmeter, scope, and schematic as is done by commercial off-the-shelf suppliers. The second method is to use a fault dictionary along with expensive automatic test equipment. The third method uses guided probing that is directed by expensive automatic test equipment.

Manual isolation is time consuming and very costly in terms of labor expenses. Fault dictionary isolation is not accurate enough to isolate to a single bad node or part. Guided probing is not allowed in some applications (such as a Navy depot test, for example), and is not possible in some applications (such as temperature environments and new sealed chip on-board modules. It is also desirable to minimize the use of expensive automatic test equipment.

Accordingly, it is an objective of the present invention to provide for test equipment and test methods employing signature analysis to achieve multiple fault isolation of pans contained in digital modules.

SUMMARY OF THE INVENTION

To meet the above and other objectives, the present invention provides for test equipment and test methods employing signature analysis to achieve fault isolation of digital modules when more than one fault exists. The novelty of the approach of the present invention lies in the use of signature analysis for fault isolation, whereas in the past, signature analysis has been used for pass/fail determination. The present invention does not require expensive automatic test equipment as is required in existing methods two and three outlined above in the Background section.

In accordance with the present invention, fault free and faulty signatures of a functional digital module and its parts are recorded that are derived from physical measurement or simulation of all parts. All of the parts in the digital module under test are shorted and opened (either physically or by simulation) and each resulting faulty signature is recorded in the storage memory (lookup table). Test input signals are then applied to a digital module under test. Then output signals from parts within the digital module under test are applied to masking circuitry which provides for sequential selective masking of all parts but one contained in the digital module under test. A mask sequence storage memory stores masking sequences that are used to selectively mask the parts of the digital module under test. These output signals include output signals of all parts for which isolation is desired. If the module under test does not have enough connector capacity, test points may be sent out serially using shift register circuitry.

Output signals from the masking circuitry are coupled to a multiple input shift register that performs pass/fail signature analysis on the output signals of the digital module under test. Each fault free signature and each faulty signature with its corresponding faulty part are stored in the lookup table. When a failure occurs during testing of the digital module under test, comparator circuitry is used to find a corresponding signature match to the stored faulty signatures. A message is sent as an output from the comparator circuitry identifying the failed part so that the digital module under test can be repaired.

In operation, using test input signals (or test patterns) applied to the digital module under test, the outputs of all parts but one are selectively masked, and the signatures derived from each non-masked part are sequentially recorded. Testing is achieved by unmasking the outputs of each part, one at a time, starting with the furthest upstream part while repeating the input patterns and recording the output signatures. Comparison of the output signatures with the stored signatures is performed by the multiple input shift register and comparator circuitry. A message is sent as an output signal from the comparator circuitry identifying failed parts, i.e., those having signatures that do not match the stored fault-free signatures. These parts are replaced one at a time, starting with the furthest upstream part. Retesting of the module under test is done after each part replacement to avoid replacing good parts. A list of parts that are to be replaced can be determined automatically by storing the input to output part hierarchy.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3 illustrates test methodology employed with the test equipment of FIGS. 1 and 2.

DETAILED DESCRIPTION

Figure 1:
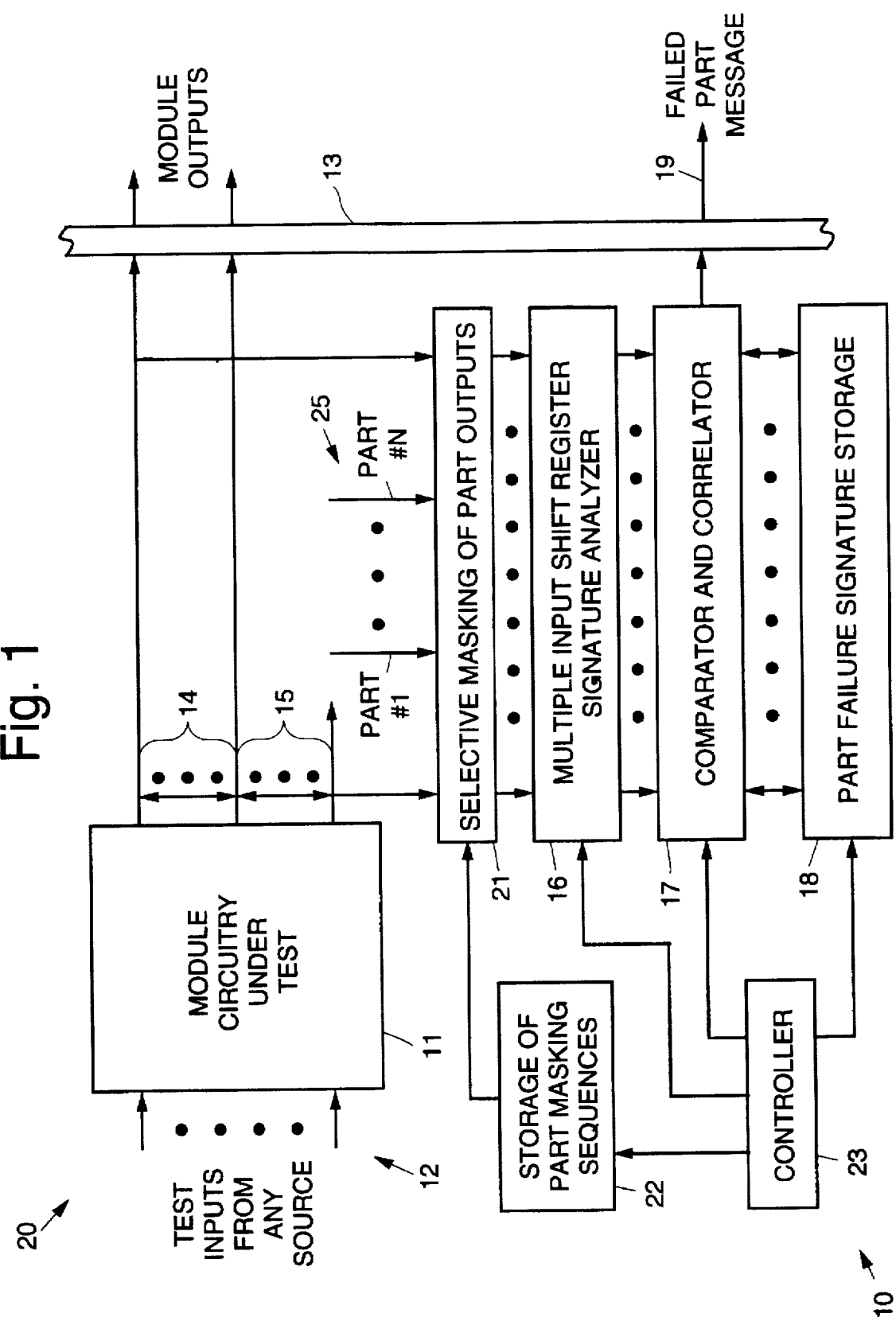
FIG. 1 shows a first embodiment of test equipment in accordance with the principles of the present invention.
Figure 2:
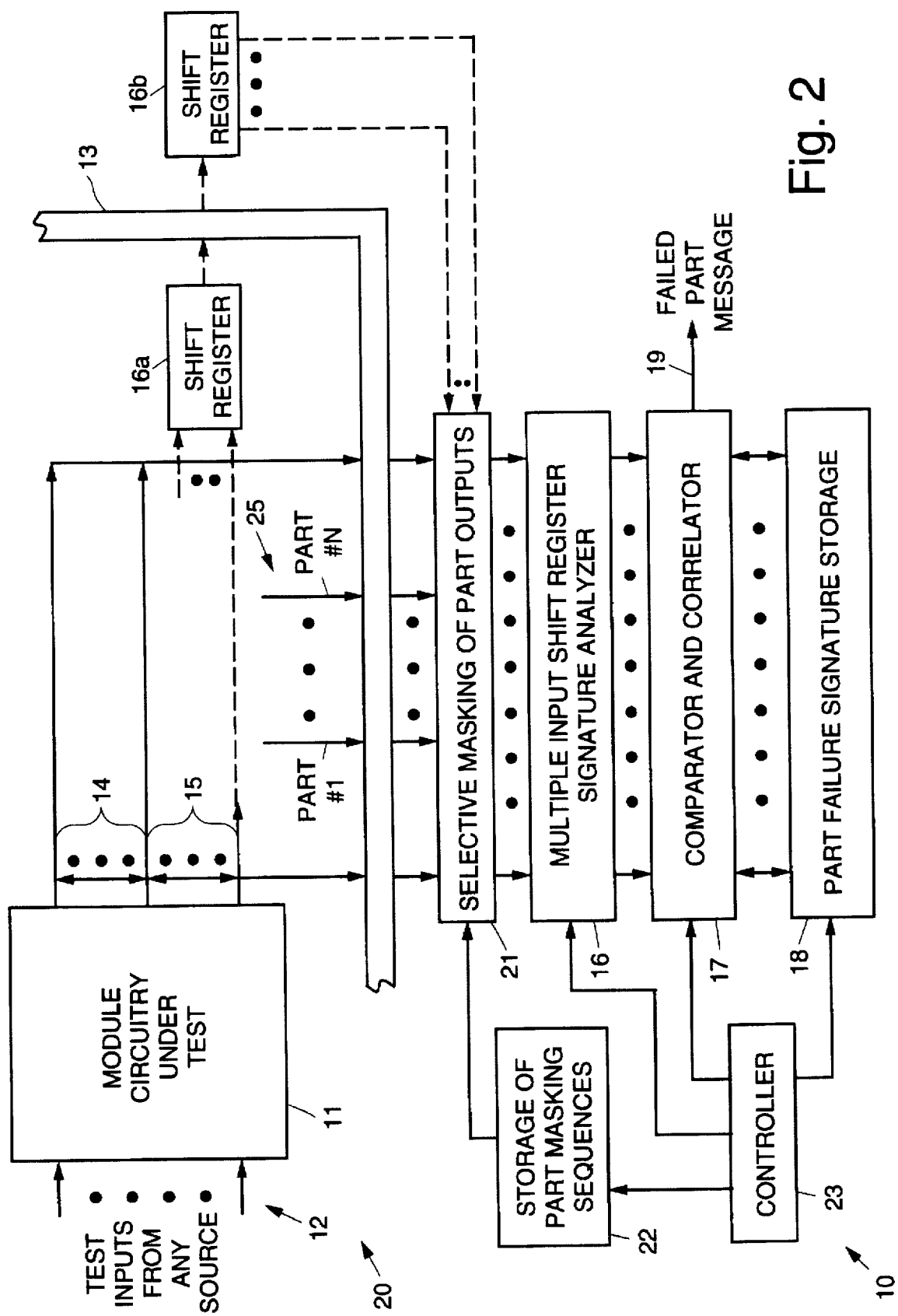
FIG. 2 shows a second embodiment of test equipment in accordance with the present invention.

Referring to the drawing figures, FIGS. 1 and 2 shows two embodiments of test equipment 10 in accordance with the principles of the present invention. The test equipment 10 shown in FIGS. 1 and 2 uses signature analysis to provide multiple fault isolation of digital module circuitry under test 11. FIG. 3 illustrates test methodology 30 employed using the test equipment 10 of FIGS. 1 and 2.

Referring to FIG. 1, it shows a digital module 20 that includes the digital module circuitry under test 11 and the present test equipment disposed on the module 20. The digital module circuitry under test 11 has a plurality of test inputs 12 derived from a test signal source. Signal outputs 14 of the digital module circuitry under test 11 are sampled and monitored along with test points 15 of the digital module circuitry under test 11. In addition, outputs 25 of a plurality of components or parts (#1–#N) of the digital module under test 11 are also sampled. The signal outputs 14 of the digital module circuitry under test 11 are coupled off of the module 11 by way of a module connector 13.

The test equipment 10 is shown as comprising part of the module 20 and includes masking circuitry 21 that is coupled to a mask memory 22 for storing part masking sequences. The masking circuitry 21 receives the signal outputs 14 and the outputs 25 of the plurality of parts of the digital module under test 11. These signals are processed using the masking circuitry 21 and stored masking sequences from the mask memory 22 to selectively mask the outputs 25 of all parts but one of the parts.

Outputs of the masking circuitry 21 are coupled to a multiple input shift register signature analyzer 16, that is coupled to receive the signals derived from the module outputs 14 and module test points 15. A description of the multiple input shift register signature analyzer 16 is provided in a book entitled "Built-In Test for VLSI: Pseudo-random Techniques", by Paul H. Bardell et al. John Wiley & Sons, 1987, Chapter 5. Outputs of the multiple input shift register signature analyzer 16 are coupled to a comparator and correlator 17.

Failed part messages 19 are output from the comparator and correlator 17 and are coupled from the module 20 by way of the module connector 13. The comparator and correlator 17 is coupled to a part failure signature storage device 18 or memory lookup table 18. The signature storage device 18 stores or records fault free signatures from the digital module under test 11 that are derived from physical measurement or simulation of all components thereof. The stored fault free signatures are used for comparison in the comparator and correlator 17.

A controller 23 is coupled to the various components of the test equipment 10 that controls application of test input signals, movement of signals between the digital module circuitry under test 11, the multiple input shift register signature analyzer 16, the comparator and correlator 17, and the memory lookup table 18. This is done in a conventional manner well known to those in the digital signal processing art and will not be described in detail herein.

The second embodiment of the test equipment 10 is shown in FIG. 2 which shows an embodiment wherein the signature analysis is performed external to the module 20 as part of a separate circuit, such as an application specific integrated circuit (ASIC), for example. The second embodiment of the test equipment 10 is configured in a substantially identical manner as the embodiment of FIG. 1, but in the second embodiment, the signal outputs 14, test points 15, and the outputs 25 of the plurality of parts of the digital module circuitry under test 11 are coupled off of the module 20 using the module connector 13 and applied to inputs of the masking circuitry 21.

The signature analysis and signal processing performed by the embodiments of the test equipment 10 shown in FIGS. 1 and 2 is substantially the same and will be described with reference to FIG. 3. More specifically, FIG. 3 illustrates test methodology 30 employed with the test equipment of FIGS. 1 and 2. The test methodology 30 comprises the following steps.

Fault free and faulty part signatures of a functional digital module are recorded and stored in the lookup table 18 that are derived from physical measurement or simulation of all components thereof, illustrated by step 31. Faulty signatures are determined using test input patterns applied to the test inputs 12 of the functional digital module, and each internal part is shorted and opened either physically or by simulation with the test inputs 12 applied thereto, and signatures for each unmasked part are recorded. The functional digital module is then replaced by a digital module under test 11.

Test input signals are applied to the digital module under test 11, and outputs 25 of all components or parts of the module under test 11 except one are then selectively masked using the masking circuitry 21 and masking sequences stored in the mask memory 22, illustrated by step 32. Test input patterns are applied to the test inputs 12 of the digital module under test 11, and each part is unmasked one at a time, illustrated by step 33. Signatures for each unmasked part are then recorded illustrated by step 34. During testing of the digital module circuit under test 1 I, the failed part signatures are compared in the comparator and correlator 17 with the stored list of signatures, illustrated by step 35. The failed signatures are then correlated to the specific part failure in the comparator and correlator 17, illustrated by step 36, and the failed part message 19 is produced. Suspect parts are then replaced, one at a time, starting with the furthest upstream part, illustrated by step 37. The digital module circuit under test 11 is then retested after each part is replaced to avoid replacing good parts, illustrated by step 38.

Other failures, such as adjacent pin shorts, and the like, may be tested using the present method 30, limited only by the size of the multiple input shift register signature analyzer 16 and the signature storage device 18 or memory lookup table 18. Test points may be scanned out of the storage device 18 or memory lookup table 18 as required by a user. If the number of test points 15 exceed the capacity of the connector 13, the test points 15 may be serially scanned out of the digital module under test 11 as required by a user using output and input shift registers 16a, 16b respectively coupled between the digital module under test 11 and the connector 13 and from the connector 13 and the multiple input shift register 16.

The present invention allows fault isolation to a failed module part without lengthy physical probing. This capability is more critical with circuits made using newly developed technologies such as sealed-chip on-board modules where physical probing may not be feasible. In addition, the present invention allows fault isolation without expensive module test equipment. Isolation may be done at the unit or system level, even during temperature tests. For the case where test inputs are generated on the module, the present invention provides a cost-effective way to achieve vertical test commonality at the module, unit and system levels. This avoids the cost of developing separate tests at these levels. Common tests across levels also minimize test situations that cannot be verified. Manufacturing test costs are significantly reduced in light of the advantages provided by the present invention. Field test costs are also reduced, which increases customer satisfaction.

The present invention may be produced in the form of a standardized ASIC design having the signature analysis circuitry embedded therein. The present invention may be used by commercial off-the-shelf circuit board suppliers who currently perform manual fault isolation because the high cost of automatic test equipment cannot be justified.

Thus, test equipment and test methods employing signature analysis to achieve multiple fault isolation of parts contained in digital modules have been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. Test equipment for providing fault isolation of a digital module under test, said digital module under test having a plurality of test input signals applied thereto, a plurality of parts that are to be tested, and a plurality of signal outputs, said test equipment comprising:
   a mask memory for storing part masking sequences;
   masking circuitry coupled to the mask memory for receiving outputs of the plurality of parts, and for selectively masking the outputs from all parts but one of the plurality of parts;
   a multiple input shift register signature analyzer coupled to masking circuitry for receiving unmasked output signals from the unmasked part;

a memory lookup table for storing fault-free and faulty signatures of parts of the digital module under test; and a comparator and correlator coupled between the multiple input shift register signature analyzer and the memory lookup table for comparing failed signatures the occur during testing of the module under test with the stored signatures and for correlating the failed signatures to the specific failed part to generate fault isolation output messages, and for outputting the messages.

2. A test method for providing fault isolation of pans of a tested digital module that comprises a plurality of test inputs, a plurality of pans that are to be tested, a plurality of signal outputs, said test method comprising steps of:

storing fault free and faulty pan signatures of pans of a functional digital module;

applying test input signals to the plurality of test inputs of a tested digital module, and selectively masking outputs of all pans of the tested digital module except one using prestored masking sequences;

unmasking each pan one at a time;

recording signatures associated with failed pans and fault-free signatures from unfailed pans;

comparing signatures of the failed pans that occur during testing with the stored signatures;

correlating the signatures of the failed pans to the specific failed pan to generate a fault isolation output signal;

replacing suspect parts, one at a time, starting with a furthest upstream part; and retesting the tested digital module after each part is replaced to avoid replacing good parts.

3. The test method claim 2 wherein the step of storing fault free and faulty part signatures comprises the step of applying test input patterns to the test inputs of the tested digital module, and recording signatures for each unmasked part.

4. The test method claim 2 wherein the step of storing fault free and faulty part signatures comprises the step of physically shorting and opening every part with the test inputs applied thereto.

5. The test method claim 2 wherein the step of storing fault free and faulty part signatures comprises the step of shorting and opening by simulation every part with the test inputs applied thereto.

* * * * *